United States Patent
Mason et al.

(10) Patent No.: US 9,709,897 B2
(45) Date of Patent: Jul. 18, 2017

(54) POLARIZATION CONTROL OF PULSED LIGHT BEAM

(71) Applicant: Cymer, LLC, San Diego, CA (US)

(72) Inventors: Eric Anders Mason, San Diego, CA (US); Omar Zurita, San Diego, CA (US); Gregory Allen Rechtsteiner, San Diego, CA (US); Robert Jay Rafac, Encinitas, CA (US); Ivan B. Lalovic, San Francisco, CA (US)

(73) Assignee: Cymer, LLC, San Diego, CA (US)

( * ) Notice: Subject to any disclaimer, the term of this patent is extended or adjusted under 35 U.S.C. 154(b) by 0 days.

(21) Appl. No.: 14/925,641

(22) Filed: Oct. 28, 2015

(65) Prior Publication Data
US 2017/0123324 A1 May 4, 2017

(51) Int. Cl.
*G03B 27/52* (2006.01)
*G03B 27/42* (2006.01)
*G03F 7/20* (2006.01)

(52) U.S. Cl.
CPC .............................. *G03F 7/70191* (2013.01)

(58) Field of Classification Search
CPC ............. G03F 7/70091; G03F 7/70566; H01S 3/10061; H01S 3/10015; H01S 3/0085; H01S 3/0057; H01S 3/08054; H01S 3/1305; H01S 3/06712; H01S 5/0071; H01S 3/10053; H01S 3/1307; H01S 5/18355; H01S 5/14; H01S 3/131; H01S 2301/08; H01S 3/063; H01S 3/1103; H01S 3/1308; H01S 5/0623
See application file for complete search history.

(56) References Cited

U.S. PATENT DOCUMENTS

| | | | |
|---|---|---|---|
| 6,693,939 B2 | 2/2004 | Klene et al. | |
| 7,369,597 B2 | 5/2008 | Smith et al. | |
| 7,564,888 B2 | 7/2009 | Ershov et al. | |
| 7,643,528 B2 | 1/2010 | Partlo et al. | |
| 9,140,990 B2 | 9/2015 | Tanitsu et al. | |
| 9,146,474 B2 | 9/2015 | Kudo et al. | |

(Continued)

OTHER PUBLICATIONS

John Burnett et al., "The Trouble with Calcium Fluoride," Spie's oeMagazine, Mar. 2002, pp. 23-25.
(Continued)

*Primary Examiner* — Mesfin Asfaw
(74) *Attorney, Agent, or Firm* — DiBerardino McGovern IP Group LLC

(57) ABSTRACT

A photolithography system includes an optical system, an actuation apparatus, and a control module. The optical system includes an optical source that produces a pulsed light beam traveling along a beam path; a plurality of optical components positioned between the optical source and a photolithography exposure apparatus, at least some of the plurality of optical components configured to receive the pulsed light beam and direct the pulsed light beam to the photolithography exposure apparatus; and an optical element positioned to interact with the pulsed light beam. The actuation apparatus is coupled to the optical element. The actuation apparatus is configured to adjust a physical property of the optical element based on a control signal from the control module to thereby adjust a polarization of the pulsed light beam.

23 Claims, 9 Drawing Sheets

(56) References Cited

U.S. PATENT DOCUMENTS

| | | |
|---|---|---|
| 2005/0128458 A1 | 6/2005 | Blatchford |
| 2005/0213072 A1* | 9/2005 | Schenker ............ G03F 7/70566 |
| | | 355/71 |
| 2006/0055834 A1* | 3/2006 | Tanitsu .................. G03B 27/42 |
| | | 349/5 |
| 2007/0237192 A1 | 10/2007 | Das et al. |
| 2008/0316598 A1 | 12/2008 | Fiolka et al. |
| 2010/0128747 A1* | 5/2010 | Nagai ................. H01S 3/10061 |
| | | 372/27 |

OTHER PUBLICATIONS

V.B. Fleurov et al., "Dual-Chamber Ultra Line-Narrowed Excimer Light Source for 193 nm Lithography," Optical Microlithography XVI, Anthony Yen, Editor, Proceedings of SPIE, vol. 5040, copyright 2003, pp. 1694-1703.

John H. Burnett et al., "Intrinsic Birefringence in Calcium Fluoride and Barium Fluoride," Physical Review B, vol. 64, 241102(R), copyright 2001, 4 pages.

D.J.W. Brown et al., "XLR 500i: Recirculating Ring ArF Light Source for Immersion Lithography," Optical Microlithography XX, edited by Donis G. Flagello, Proc. of SPIE vol. 6520, 652020, copyright 2007, 8 pages.

\* cited by examiner

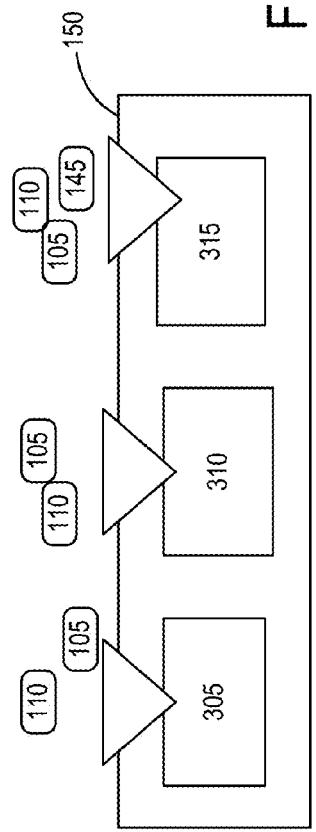
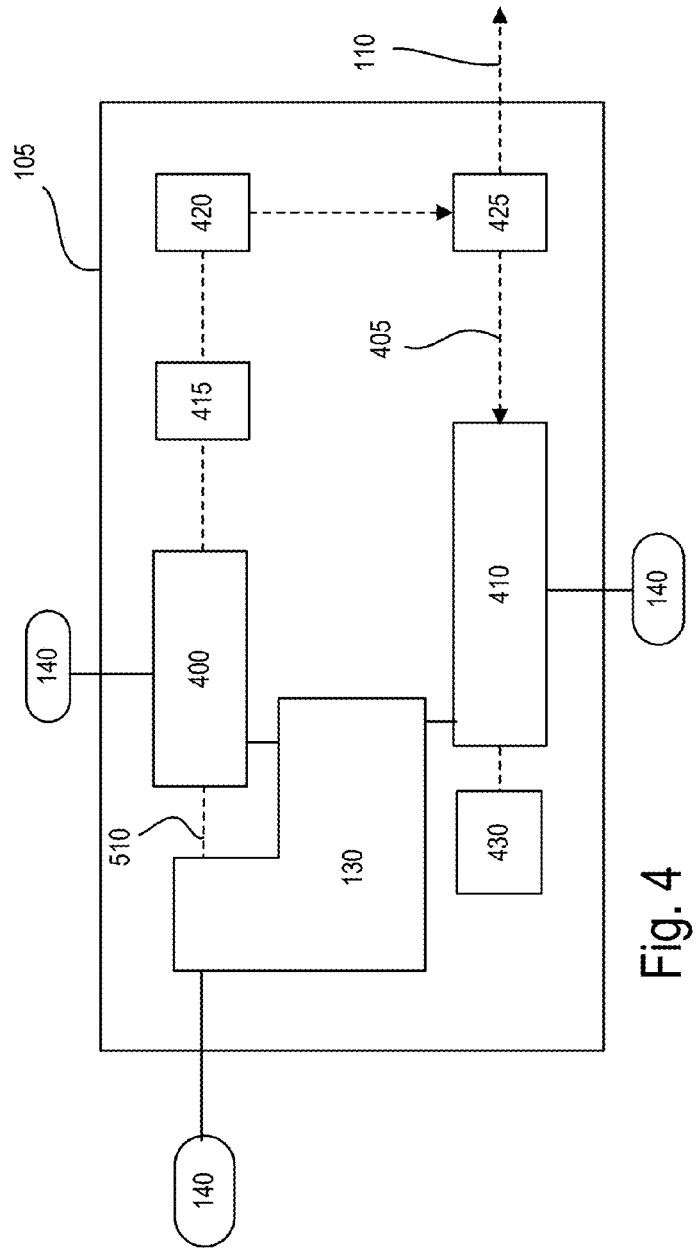

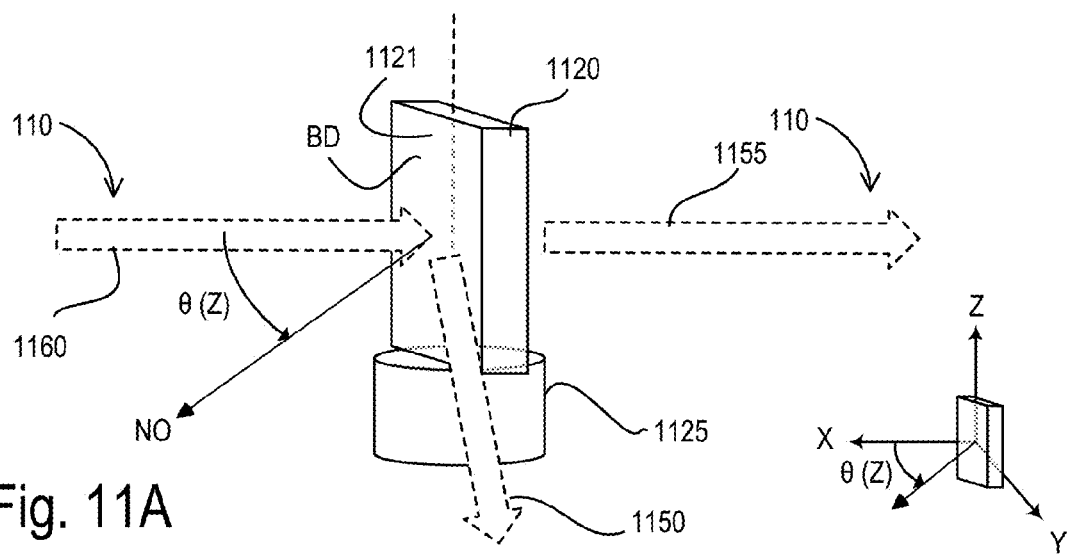
Fig. 11A
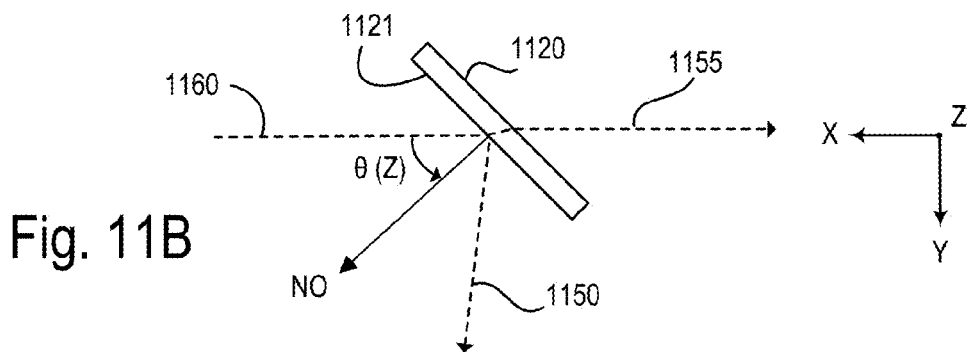
Fig. 11B
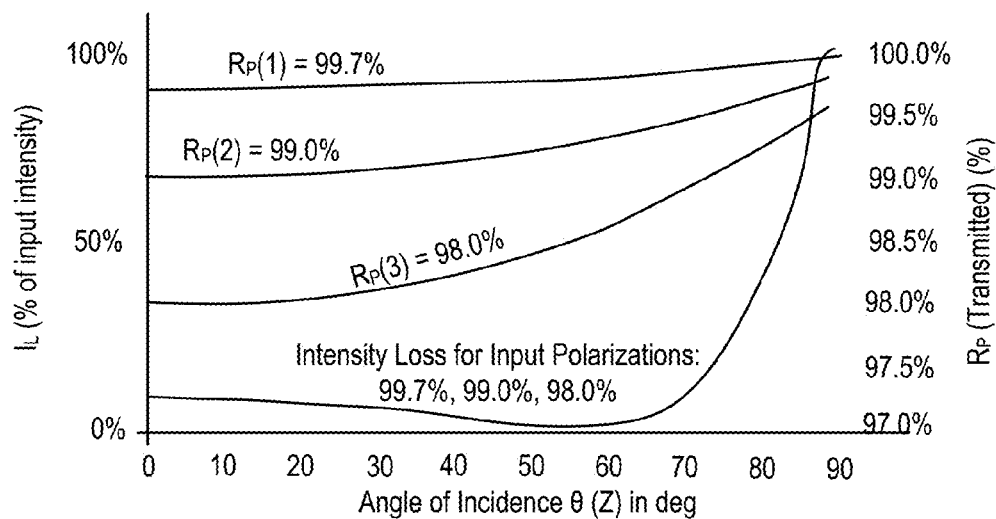
Fig. 12  Rotation about Z direction for polarization cleanup and loss vs. θ

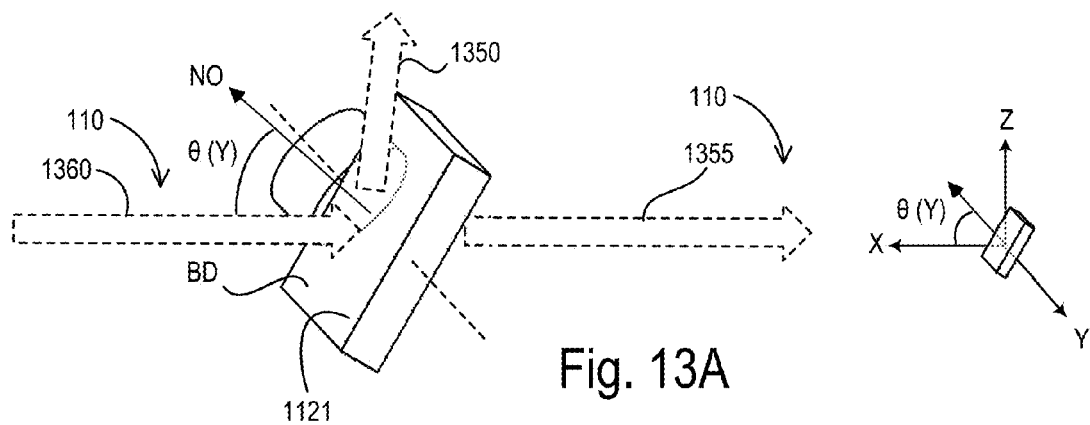
Fig. 13A
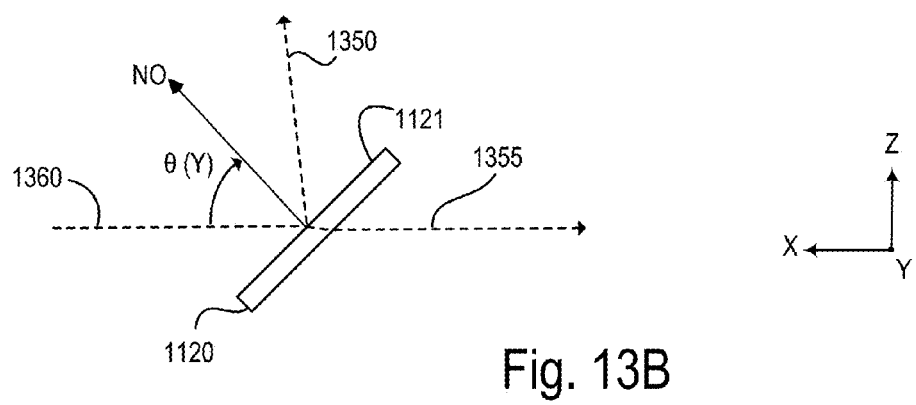
Fig. 13B
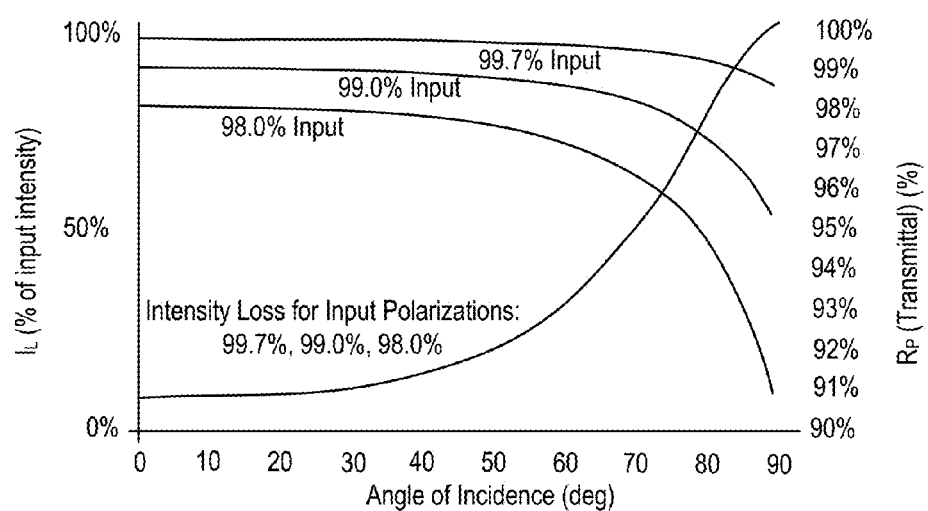
Fig. 14   Horizonal (Y axis) optic for polarization cleanup and loss vs. θ(Y)

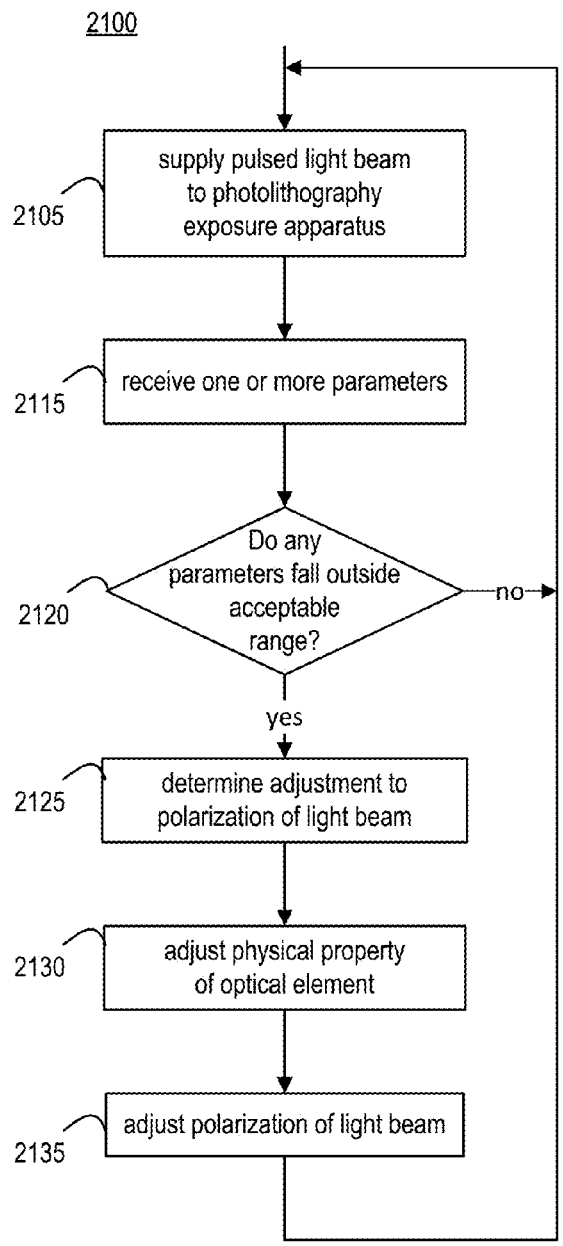
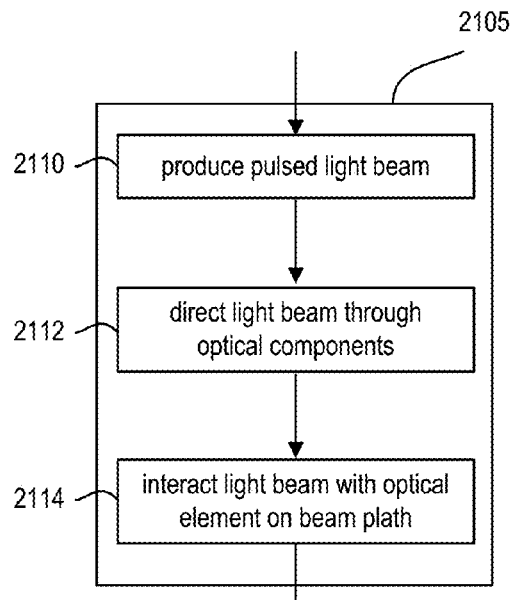
Fig. 21A
Fig. 21B

POLARIZATION CONTROL OF PULSED LIGHT BEAM

TECHNICAL FIELD

The disclosed subject matter relates to polarization control of a pulsed light beam.

BACKGROUND

Photolithography is the process by which semiconductor circuitry is patterned on a substrate such as a silicon wafer. A photolithography light source provides the deep ultraviolet (DUV) light used to expose a photoresist on the wafer. DUV light is a range of light on the violet side of the color spectrum, beyond what the human eye can see. For example, DUV light can be light having wavelengths that range between about 100 nanometers (nm) to about 400 nm. DUV light for photolithography can be generated by excimer light sources. Often, the light source is a laser source and the pulsed light beam is a pulsed laser beam. The light beam is passed through a beam delivery unit, filtered through a reticle (or mask), and then projected onto a prepared silicon wafer. In this way, a chip design is patterned onto a photoresist that is then etched and cleaned, and then the process repeats.

SUMMARY

In some general aspects, a photolithography system includes an optical system, an actuation apparatus, and a control module. The optical system includes an optical source that produces a pulsed light beam traveling along a beam path; a plurality of optical components positioned between the optical source and a photolithography exposure apparatus, at least some of the plurality of optical components configured to receive the pulsed light beam and direct the pulsed light beam to the photolithography exposure apparatus; and an optical element positioned to interact with the pulsed light beam. The actuation apparatus is coupled to the optical element. The actuation apparatus is configured to adjust a physical property of the optical element based on a control signal to thereby adjust a polarization of the pulsed light beam. The control module is connected to the photolithography exposure apparatus, the optical system, and the actuation apparatus. The control module is configured to: receive one or more parameters from one or more of the photolithography exposure apparatus and the optical system, analyze the one or more parameters to determine whether any of the parameters is outside an acceptable range of target values; and, if the determination indicates that any of the parameters is outside the acceptable range of target values, send the control signal to the actuation apparatus to adjust a physical property of the optical element to thereby alter the polarization of the pulsed light beam.

Implementations can include one or more of the following features. For example, the optical element can include an at least partially-transmissive optical element. The at least partially-transmissive optical element can lack an anti-reflective coating. The at least partially-transmissive optical element can direct the pulsed light beam through an optical pulse stretcher. The at least partially-transmissive optical element can be made of calcium fluoride. The at least partially-transmissive optical element can be made of a bulk material that transmits at least 90% of light having a wavelength that is between 100 nm and 400 nm.

The actuation apparatus can include a rotation mechanism such as a stage to which the optical element is fixed and the rotation mechanism adjusts an angle of the optical element relative to an optical axis of the pulsed light beam. The rotation mechanism can adjust an angle of the optical element about a perpendicular element axis that is perpendicular to a first direction of polarization of the pulsed light beam. The rotation mechanism can adjust an angle of the optical element about a parallel element axis that is parallel with a first direction of polarization of the pulsed light beam.

The control module can receive one or more parameters from one or more of the photolithography exposure apparatus and the optical system by receiving a measurement of the polarization of the pulsed light beam.

The actuation apparatus can be a stress apparatus that is configured to adjust a stress of the optical element based on the control signal to thereby adjust the polarization of the pulsed light beam. The stress apparatus can be thermally coupled to the optical element and can be configured to adjust the stress of the optical element by adjusting a temperature of the optical element.

The control module can be configured to determine the control signal based on a determined adjustment to the property of the pulsed light beam.

The optical element can include a variable optical phase retarding element.

The optical element can be between the optical source that produces a pulsed light beam and the plurality of optical components.

The optical source can include a two-stage laser system that includes a master oscillator that provides a seed light beam to a power amplifier.

In other general aspects, a photolithography method includes supplying a pulsed light beam to a photolithography exposure apparatus by producing, at an optical source, a pulsed light beam traveling along a beam path; directing the produced pulsed light beam through a plurality of optical components positioned between the optical source and the photolithography exposure apparatus; and interacting the pulsed light beam with an optical element. The method includes receiving one or more parameters relating to the pulsed light beam or to the photolithography exposure apparatus and determining whether any of the received one or more parameters is outside an acceptable range of target values for that parameter. If it is determined that a received value is not within its acceptable range of target values, then an adjustment to a polarization of the pulsed light beam is determined and a physical property of the optical element is adjusted based on the determined adjustment to the pulsed light beam polarization to thereby adjust the polarization of the pulsed light beam output from the optical element.

Implementations can include one or more of the following features. For example, the physical property of the optical element can be adjusted to thereby adjust the polarization of the pulsed light beam output from the optical element while the pulsed light beam is being supplied to the photolithography exposure apparatus.

The physical property of the optical element can be adjusted by adjusting an angle of the optical element relative to an optical axis of the pulsed light beam. The angle of the optical element relative to the optical axis can be adjusted by adjusting the angle of the optical element about a perpendicular element axis that is perpendicular to a first direction of polarization of the pulsed light beam. The angle of the optical element relative to the optical axis can be adjusted by adjusting the angle of the optical element about a parallel element axis that is parallel with a first direction of polarization of the pulsed light beam.

The one or more parameters can be received by receiving a measurement of the polarization of the pulsed light beam.

The physical property of the optical element can be adjusted by adjusting a stress of the optical element to thereby adjust the polarization of the pulsed light beam. The stress of the optical element can be adjusted by adjusting a temperature of the optical element.

DESCRIPTION OF DRAWINGS

FIG. 3 is a block diagram of an exemplary metrology system that can be used in the photolithography system of FIG. 1;

FIG. 4 is a block diagram of an exemplary optical source that can be used in the photolithography system of FIG. 1;

FIG. 11A is a perspective view of an exemplary optical element that can be used in the photolithography system of FIG. 1;

FIG. 11B is a plan view of the exemplary optical element of FIG. 11A;

FIG. 12 is a series of graphs of a polarization ratio of a light beam transmitted through the optical element of FIGS. 11A and 11B as a function of the angle of the optical element for three different input polarization ratios of the incoming light beam and a graph of an intensity loss percentage of the incoming light beam as a function of the angle;

FIG. 13A is a perspective view of an exemplary optical element that can be used in the photolithography system of FIG. 1;

FIG. 13B is a plan view of the exemplary optical element of FIG. 13A;

FIG. 14 is a series of graphs of a polarization ratio of a light beam transmitted through the optical element of FIGS. 13A and 13B as a function of the angle of the optical element for three different input polarization ratios of the incoming light beam and a graph of an intensity loss percentage of the incoming light beam as a function of the angle;

FIGS. 21A and 21B are flow charts of exemplary procedures performed by the photolithography system of FIG. 1.

DESCRIPTION

Figure 1:
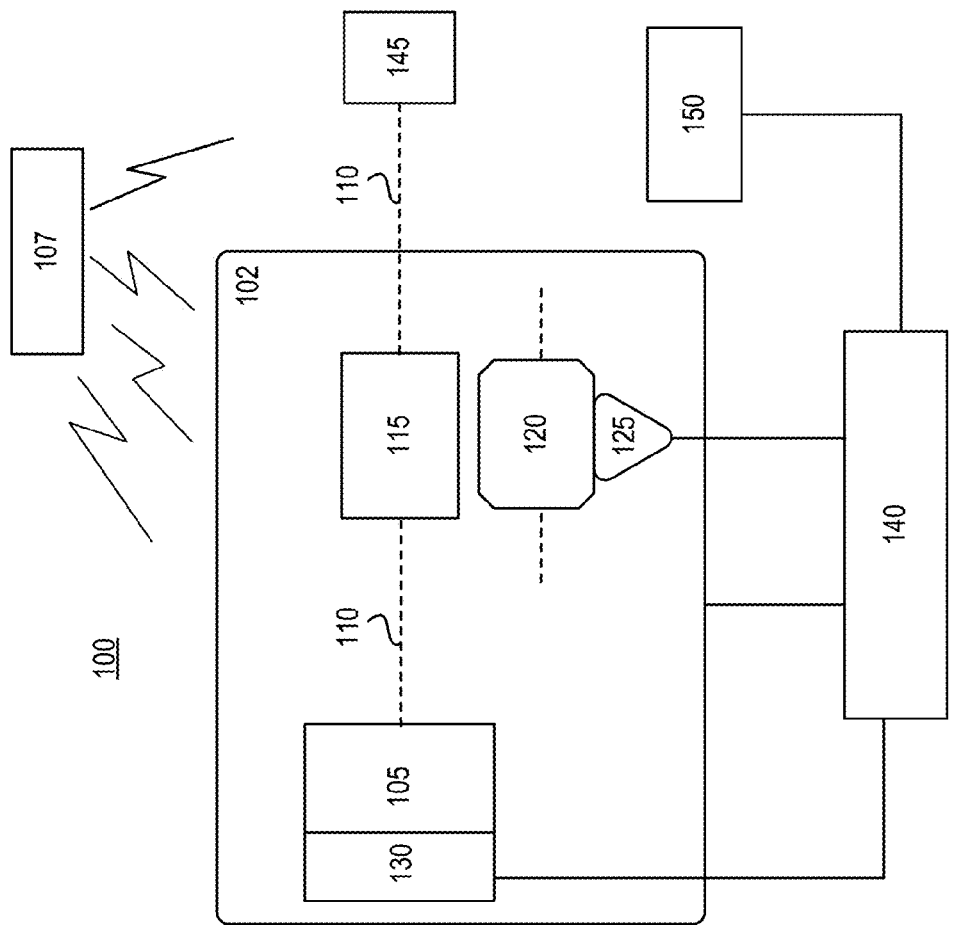
FIG. 1 is a block diagram of a photolithography system including an optical source that produces a light beam and has an optical element that is used to adjust a polarization of the light beam during operation of the optical source.
Figure 6:
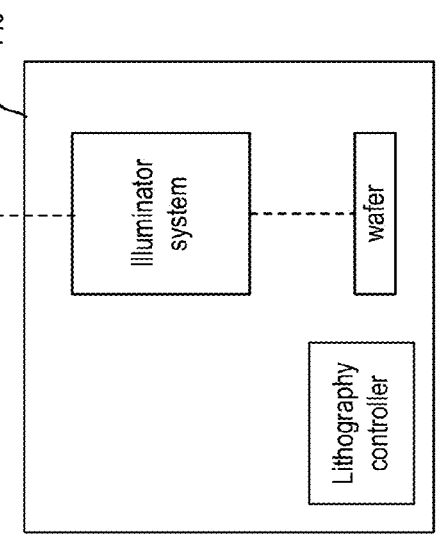
FIG. 6 is a block diagram of an exemplary output apparatus of the photolithography system of FIG. 1.

Referring to FIG. 1, a photolithography system 100 includes an optical system 102 and a control module 140 that is connected to the optical system 102. The optical system 102 includes an optical source 105, which produces a pulsed light beam 110 that propagates along a beam path to an output apparatus 145 (such as a lithography exposure apparatus that patterns microelectronic features on a wafer, as shown in FIG. 6). The optical system 102 includes a plurality 115 of optical components placed between the optical source 105 and the output apparatus 145, the optical components 115 being configured to modify aspects of the light beam 110 and to direct the light beam 110 to the output apparatus 145. For example, the optical components 115 can include reflective or refractive optical elements, optical pulse stretchers, and optical apertures (including automated shutters).

If the output apparatus 145 is a photolithography system, then the output apparatus 145 uses a light beam 110 having a wavelength in the deep ultraviolet (DUV) range, for example, with wavelengths of 248 nanometers (nm) or 193 nm. The size of the microelectronic features patterned on the wafer depends on the wavelength of the light beam 110, with a shorter wavelength enabling a smaller minimum feature size. If the wavelength of the light beam 110 is 193 nm and the photolithography system is an immersion system, then the minimum size of the microelectronic features can be, for example, 50 nm or less. As another example, if the wavelength of the light beam 110 is 248 nm, the minimum size of the microelectronic features can be 100 nm or less.

The optical system 102 includes an optical element 120 placed or positioned (for example, on, near, or around the beam path of the light beam 110) so that at least a portion of the pulsed light beam 110 interacts with the optical element 120. The photolithography system 100 includes an actuation apparatus 125 coupled to the optical element 120 and configured to adjust a physical property of the optical element 120 based on a control signal (from a control module 140) to thereby adjust a polarization of the pulsed light beam 110. Moreover, the photolithography system 100 is configured so that the polarization of the pulsed light beam 110 can be actively adjusted using the optical element 120 while the pulsed light beam 110 is being provided to the output apparatus 145. If the output apparatus 145 is a lithography exposure apparatus that patterns microelectronic features on a wafer, then the active adjustment of the polarization of the pulsed light beam 110 can occur while the pulsed light beam 110 is exposing the wafer, for example, on a pulse-to-pulse basis. The optical element 120 can include any one or more of reflective portions, refractive portions, and partially-reflective portions, as discussed in greater detail below.

The pulsed light beam 110 is an electromagnetic wave, and its electric field oscillates perpendicularly to its direction of propagation. The polarization of the pulsed light beam 110 is the spatial direction in which the electric field is oriented and in which it oscillates. It is possible for the pulsed light beam 110 to be linearly polarized; that is, there is one direction perpendicular to the beam axis of the pulsed light beam 110 in which its electric field oscillates. The magnetic field of the pulsed light beam 110 oscillates in a direction that is perpendicular to both its beam axis and the electric field. It is possible for the pulsed light beam 110 to be circularly or elliptically polarized; that is, the electric field may rotate at the optical frequency. Additionally, it is possible for the pulsed light beam 110 to have its electric field direction be parallel to a plane of incidence on a device (and thus be "p-polarized") or have its electric field direction be perpendicular to that plane of incidence (and thus be "s-polarized").

Many optical materials (such as glass) are isotropic in that they simply preserve the polarization of the light beam 110 as the light beam 110 propagates through the bulk material, and do not differentiate between polarization states. However, there are some classes of materials classified as anisotropic, birefringent, or optically active in which this is not the case and the polarization of the light beam 110 can be modified as it passes through such materials.

The polarization of the pulsed light beam 110 can fluctuate or change from an ideal or target polarization during operation of the optical system 102 due to various disturbances (such as temperature gradients, stress gradients, pressure gradients, optical distortions, change in operating conditions, etc.) that act on the optical system 102 and the output apparatus 145. The ideal or target polarization can be defined as a target polarization ratio between a power of the pulsed light beam 110 along the perpendicular direction (the s-polarization) and a power of the pulsed light beam 110 along the parallel direction (the p-polarization), as discussed in detail below. A change in the polarization of the light beam 110 would change the polarization ratio of these two powers. Such change in polarization of the pulsed light beam 110 can be caused by a change in the properties of the optical elements that interact with the pulsed light beam 110 as it passes through the optical system 102 and the output apparatus 145.

For example, if a transmissive optic in the path of the light beam 110 is ideally isotropic and therefore is supposed to preserve the polarization of the light beam 110, then thermally-induced stress birefringence in such an isotropic transmissive optic modifies the polarization of the light beam 110 from its desired or ideal polarization state. Stress birefringence results when isotropic materials of the optics become stressed or deformed (for example, stretched or bent) such that their isotropy is lost in one direction. Thus, a birefringent optic refracts light in a different manner than an isotropic optic. In particular, an optic that becomes birefringent refracts the s and p polarizations differently than an isotropic optic, and such a change causes a degradation in the polarization ratio. Because of the stress birefringence that occurs in the optic, the polarization of the pulsed light beam 110 is modified from its ideal or target polarization as it interacts with the optic.

Additionally, many optical components or devices are not ideally isotropic, but have inherent levels of birefringence. Thus, without any added stress, many optics modify the polarization of the light beam 110 when interacting with the light beam 110. This inherent birefringence can be further increased by the added stress (mechanically imposed or thermally imposed) or by optically-induced damage. Thus, while it is possible to predict how the polarization of the light beam 110 is impacted by an optic without any added stress, it becomes more difficult to maintain the low level of the inherent birefringence during operation of the optical system 102 and the output apparatus 145. It becomes important to therefore monitor the polarization of the light beam 110 during operation to actively offset the change in polarization that occurs due to these stresses.

Additionally, some operating parameters (such as the duty cycle and the power) of the pulsed light beam 110 can impact the polarization of the light beam 110. For example, as the duty cycle and the energy, and therefore, the power of the pulsed light beam 110 increases, the polarization of the pulsed light beam 110 drifts from an ideal or target polarization due to thermally induced stress birefringence.

Fluctuations in the polarization (or the polarization ratio) of the pulsed light beam 110 can cause a degradation in performance of various optical devices within the optical system 102 or the output apparatus 145. Thus, by providing a system and technique for controlling the polarization (and also the polarization ratio) of the pulsed light beam 110 during operation of the photolithography system 100, such degradation in the optical devices can be mitigated or reduced. Details about polarization control are provided below following a general discussion regarding the photolithography system 100.

Figure 2:
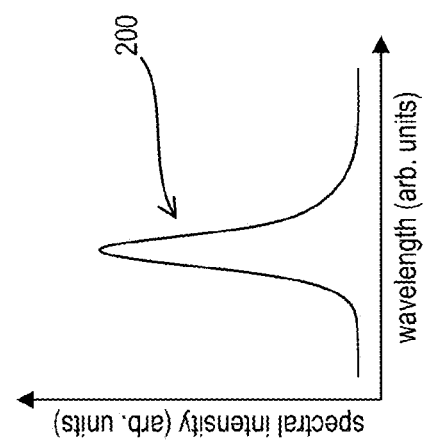
FIG. 2 is a graph of an exemplary optical spectrum, which shows the spectral intensity as a function of a wavelength or optical frequency, of a light beam produced by the optical source of FIG. 1.

Referring to FIG. 2, the optical spectrum 200 (or emission spectrum) of a pulsed light beam 110 produced by the optical source 105 contains information on how the optical energy or power is distributed over different wavelengths. The optical spectrum 200 of the light beam 110 is depicted in the form of a diagram where the spectral intensity (not necessarily with an absolute calibration) is plotted as a function of the wavelength or optical frequency. The optical spectrum 200 can be referred to as the spectral shape or intensity spectrum of the light beam 110. Spectral properties or features of the light beam 110 include any aspect or representation of the intensity spectrum. For example, bandwidth and wavelength are spectral features of the light beam 110. The bandwidth of the light beam 110 is a measure of the width of this spectral shape, and this width can be given in terms of wavelength or frequency of the laser light. Any suitable mathematical construction (that is, a metric) related to the details of the optical spectrum 200 can be used to estimate a value that characterizes the bandwidth of the light beam. For example, the full width of the spectrum at a fraction (A) of the maximum peak intensity of the spectral shape (referred to as FWAM) can be used to characterize the light beam bandwidth. As another example, the width of the spectrum that contains a fraction (B) of the integrated spectral intensity (referred to as EB) can be used to characterize the light beam bandwidth.

During operation of the optical source, the various disturbances 107 can act on the optical system 102 and the light beam 110 to additionally modify spectral features (such as the bandwidth or the wavelength) of the light beam 110. Because of the disturbances 107, the actual spectral feature of the light beam 110 at the output apparatus 145 may not correspond to or match with the spectral feature that is desired at the output apparatus 145. Thus, the actual spectral feature (such as a characteristic bandwidth) of light beam 110 can be measured or estimated during operation by estimating a value of a metric from the optical spectrum. An operator or an automated system (for example, a feedback controller) can use the measured or estimated bandwidth to adjust the properties of the optical source 105 and to adjust the optical spectrum of the light beam 110 using a spectral actuation system 130. The spectral actuation system 130 includes two or more actuation modules that are coupled to respective two or more actuatable apparatus of the optical source 105. Each actuatable apparatus is altered by its actuation module (under the control of the control module 140) to adjust the spectral feature of the pulsed light beam 110. In this way, the effect of these disturbances 107 on the spectral features of the light beam 110 can be corrected.

The photolithography system 100 includes a metrology system 150, which can include one or more sub-systems for observing or measuring characteristics of the photolithography system 100. The control module 140 and the metrology system 150 can alternatively or additionally work in combination to, among other things, continuously determine whether to send signals to one or more of the spectral actuation system 130 and the actuation apparatus 125 to either adjust an aspect of the optical source 105 or to adjust a polarization of the pulsed light beam 110.

Referring also to FIG. 3, the metrology system 150 includes an observation system 305 that is configured to observe one or more polarization characteristics (such as a polarization) associated with the pulsed light beam 110. The observation system 305 is configured to output a value for the polarization characteristic. For example, the observation system 305 can sense or measure one or more energies of the pulsed light beam 110, and the sensed pulse energy or energies can be used to compute the one or more polarization characteristics (such as the polarization ratio), as discussed below.

The metrology system 150 also includes a spectral feature unit 310 that is configured to measure a spectral feature of the pulsed light beam 110 output from the optical source 105. The metrology system 150 can include other measurements units 315; for example, a line center analysis module 420 (shown in FIG. 4) is an example of one type of measurement unit 315 that can be used to measure the wavelength (for example, the center wavelength) of a seed light beam 405 (within the optical source 105) or the pulsed light beam 110.

The control module 140 is connected to the spectral actuation system 130, the actuation apparatus 125, and the metrology system 150, among other things. A connection between the control module 140 and a specific component (such as the actuation apparatus 125) can be a wired connection or can be a wireless and non-contact connection.

The control module 140 is configured to determine, among other things, whether a measured polarization characteristic deviates too much from an acceptable value. If the deviation is outside the acceptable deviation, then the control module 140 sends a signal to the actuation apparatus 125 to adjust a physical property of the optical element 120 to thereby adjust or alter the polarization of the pulsed light beam 110.

Additionally, the control module 140 is configured to determine whether the measure of the spectral feature from the spectral feature unit 310 is close enough to a desired or reference value of the spectral feature. If the measured spectral feature is not close enough to a reference value, then the control module 140 could send a signal to the spectral actuation system 130 to adjust the spectral feature to a new value that is closer to the reference value. In some implementations, the control module 140 sends a signal to one actuation module within the spectral actuation system 130 to effect the adjustment or change in the spectral feature. In addition to controlling the spectral feature such as the bandwidth, another spectral feature such as the wavelength can be controlled by way of the spectral actuation system 130.

Referring to FIG. 4, an exemplary optical source 105 is a pulsed light source that produces a pulsed amplified light beam (such as a pulsed laser beam) as the light beam 110. As shown in the example of FIG. 4, the optical source 105 is a multi-stage (for example, two-stage) laser system that includes a master oscillator (MO) 400 that provides a seed light beam 405 to a power amplifier (PA) 410. The master oscillator 400 typically includes a gain medium in which amplification occurs and an optical feedback mechanism such as an optical resonator in which the gain medium is placed. The power amplifier 410 typically includes a gain medium in which amplification occurs when seeded with the seed light beam 405 from the master oscillator 400. If the power amplifier 410 is designed as a regenerative ring resonator then it is described as a power ring amplifier (PRA), and in this case, enough optical feedback can be provided from the ring design. The master oscillator 400 enables fine tuning of spectral parameters such as the center wavelength and the bandwidth at relatively low output pulse energies (when compared with the output of the power amplifier 410). The power amplifier 410 receives the output (the seed light beam 405) from the master oscillator 400 and amplifies this output to attain the necessary powers for output to use in the output apparatus 145 (for example, for photolithography).

The master oscillator 400 includes a discharge chamber having two elongated electrodes, a laser gas that serves as the gain medium, a fan for circulating the gas between the electrodes. A laser resonator is formed between one or more elements of the spectral actuation system 130 (such elements can act as a spectral feature selection system) on one side of the discharge chamber and an output coupler 415 on a second side of the discharge chamber. The optical source 105 can also include a line center analysis module (LAM) 420 that receives an output from the output coupler 415 and provides information to one of the other measurements units 315 of the metrology system 150 shown in FIGS. 1 and 3. The optical source 105 can also include one or more beam modification optical systems 425 that modify the size and/or shape of the seed light beam 405 or the pulsed light beam 110 as needed.

The line center analysis module 420 is an example of one type of measurement unit 315 that can be used to measure the wavelength (for example, the center wavelength) of the seed light beam 405 or the pulsed light beam 110.

The laser gas used in the discharge chamber of the master oscillator 400 can be any suitable gas for producing a laser beam around the required wavelengths and bandwidth. For example, the laser gas can be argon fluoride (ArF), which emits light at a wavelength of about 193 nm, or krypton fluoride (KrF), which emits light at a wavelength of about 248 nm.

The power amplifier 410 includes a power amplifier discharge chamber, and, if it is a regenerative ring amplifier, the power amplifier also includes a beam return (such as a reflector) 430 that returns (via reflection, for example) the light beam back into the discharge chamber to form a circulating and looped path (in which the input into the ring amplifier intersects the output out of the ring amplifier). The power amplifier discharge chamber includes a pair of elongated electrodes, a laser gas that serves as the gain medium, and a fan for circulating the gas between the electrodes. The laser gas used in the discharge chamber of the power amplifier 410 can be any suitable gas for amplifying the seed light beam 405 output from the master oscillator 400. For example, the laser gas can be argon fluoride (ArF), which emits light at a wavelength of about 193 nm. The seed light beam 405 is amplified by repeatedly passing through the power amplifier 410. Spectral features of the seed light beam 405 are determined by the configuration of the master oscillator 400, and these spectral features can be adjusted by adjusting a light beam 510 that is produced within the master oscillator 400. The beam modification optical system 425 provides a way (for example, a partially-reflecting mirror) to in-couple the seed light beam 405 and to out-couple a portion of the amplified radiation from the power amplifier 410 to form the output light beam 110.

Figure 5:
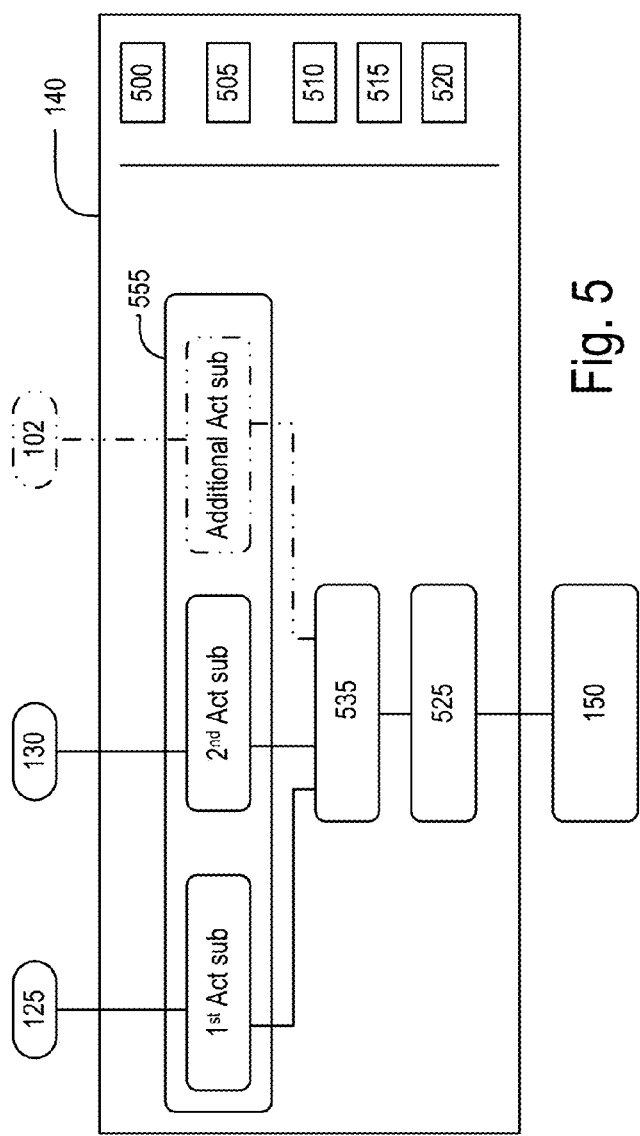
FIG. 5 is a block diagram of an exemplary control module of the photolithography system of FIG. 1.

Referring to FIG. 5, details about the control module 140 are provided that relate to the aspects of the system and method described herein. The control module 140 can include other features not shown in FIG. 5. In general, the control module 140 includes one or more of digital electronic circuitry, computer hardware, firmware, and software.

The control module 140 includes memory 500, which can be read-only memory and/or random access memory. Storage devices suitable for tangibly embodying computer program instructions and data include all forms of non-volatile memory, including, by way of example, semiconductor memory devices, such as EPROM, EEPROM, and flash memory devices; magnetic disks such as internal hard disks and removable disks; magneto-optical disks; and CD-ROM disks. The control module 140 can also include one or more input devices 505 (such as a keyboard, touch screen, microphone, mouse, hand-held input device, etc.) and one or more output devices 510 (such as a speaker or a monitor).

The control module 140 includes one or more programmable processors 515, and one or more computer program products 520 tangibly embodied in a machine-readable storage device for execution by a programmable processor (such as the processors 515). The one or more programmable processors 515 can each execute a program of instructions to perform desired functions by operating on input data and generating appropriate output. Generally, the processor 515 receives instructions and data from memory 500. Any of the foregoing may be supplemented by, or incorporated in, specially designed ASICs (application-specific integrated circuits).

The control module 140 includes, for example, a metrology processing system 525, a decision processing system 535, and an actuation processing system 555 (which can include sub-systems for interfacing with each of the actuation apparatus 125 and the spectral actuation system 130). Each of these processing systems can be a set of computer program products executed by one or more processors such as the processors 515.

The metrology processing system 525 receives the output from each observation system 305, the spectral feature unit 310, and other measurement units 315 of the metrology system 150. The decision processing system 535 receives the output from the metrology processing system 525 and determines which actuation sub-systems of the actuation processing system 555 need to be activated.

While only a few processing systems are shown in FIG. 5, it is possible for the control module 140 to include other processing systems. Additionally, although the control module 140 is represented as a box in which all of the components appear to be co-located, it is possible for the control module 140 to be made up of components that are physically remote from each other.

In general, the control system 140 receives at least some information about the light beam 110 from the metrology system 150, and the metrology processing system 525 performs an analysis or analyses on the information to determine how to adjust one or more features of the optical system 102. For example, spectral features such as the bandwidth or wavelength of the light beam 110 can be adjusted, or polarization of the light beam 110 can be adjusted based on the analysis. Based on this determination, the control module 140 sends signals to the actuation processing system 555 to control operation of the optical system 102.

Referring to FIG. 6, the lithography exposure apparatus 145 includes an optical arrangement that includes an illuminator system having, for example, one or more condenser lenses, a mask, and an objective arrangement. The mask is movable along one or more directions, such as along an optical axis of the light beam 110 or in a plane that is perpendicular to the optical axis. The objective arrangement includes a projection lens and enables the image transfer to occur from the mask to the photoresist on the wafer. The illuminator system adjusts the range of angles for the light beam 110 impinging on the mask. The illuminator system also homogenizes (makes uniform) the intensity distribution of the light beam 110 across the mask. The illuminator system can clean up the polarization of the light beam 110. For example, the illuminator system can filter out the portion of the light beam 110 having an undesired polarization. The illuminator system can define specific polarization states, such as, for example, linearly polarized in the X direction, linearly polarized in the Y direction, circularly polarized, azimuthally polarized, or unpolarized.

The lithography exposure apparatus 145 can include, among other features, a lithography controller, air conditioning devices, and power supplies for the various electrical components. The lithography controller controls how layers are printed on the wafer.

The wafer is irradiated by the light beam 110. A process program or recipe determines the length of the exposure on the wafer, the mask used, as well as other factors that affect the exposure. During lithography, a plurality of pulses of the light beam 110 illuminates the same area of the wafer to form an illumination dose. The number of pulses N of the light beam 110 that illuminate the same area can be referred to as an exposure window or slit and the size of this slit can be controlled by an exposure slit placed before the mask. The exposure slit can be fixed or dynamically adjusted by the exposure apparatus 145. In some implementations, the value of N is in the tens, for example, from 10-100 pulses. In other implementations, the value of N is greater than 100 pulses, for example, from 100-500 pulses. One or more of the mask, the objective arrangement, and the wafer can be moved relative to each other during the exposure to scan the exposure window across an exposure field. The exposure field is the area of the wafer that is exposed in one scan of the exposure slit or window.

Figure 7:
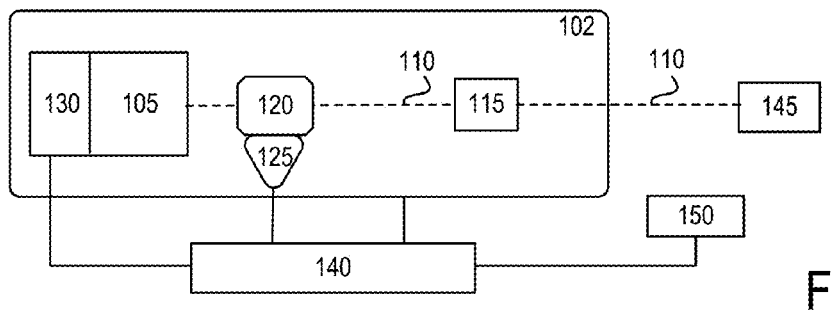
FIGS. 7-10 are block diagrams of photolithography systems showing exemplary locations of the optical element.
Figure 8:
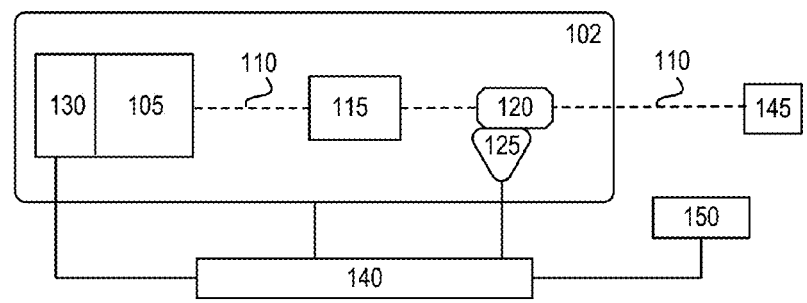

In some implementations, such as shown in FIG. 7, the optical element 120 is inserted into a path of the light beam 110 at the output of the optical source 105. For example, in this implementation, the optical element 120 can be placed at the output of the power amplifier 410. Or, the optical element 120 can be placed within an optical delay line that follows a beam splitter placed at the output of the power amplifier 410. In other implementations, as shown in FIG. 8, the optical element 120 is inserted into the path of the light beam 110 at the output of the optical components 115 and before delivery to the output apparatus 145.

Figure 9:
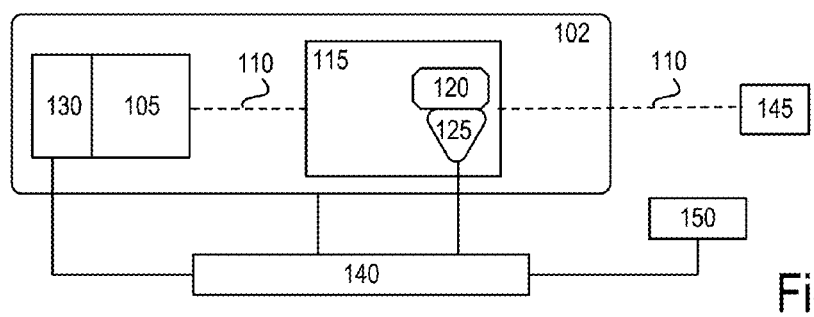
Figure 10:
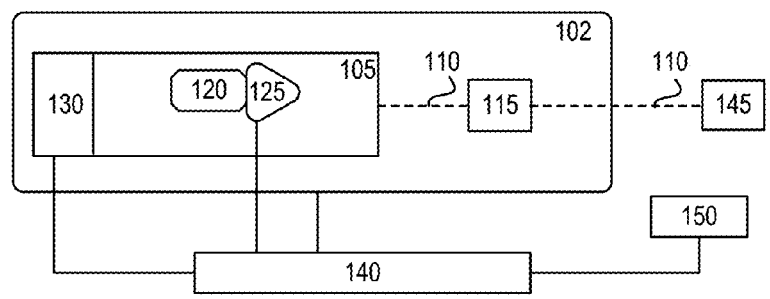

In other implementations, as shown in FIG. 9, the optical element 120 is an optical element within the plurality 115 of optical components. For example, the optical element 120 could be inserted into the plurality 115 or it could be a component already present in the plurality 115. In other implementations, as shown in FIG. 10, the optical element 120 is an optical element within the optical source 105. For example, the optical element 120 could be added to the optical source 105 or it could be a component inherent in the design of the optical source 105.

Often, it is useful to describe a linear polarization purity of the light beam 110 as a conventional metric for controlling the polarization of the light beam 110. The linear polarization purity is given by the polarization ratio $R_P$, which is defined as $R_P = \{[P(Y)-P(Z)]/[P(Y)+P(Z)]\} \times 100$, where P(Y) is the optical power of the linear p-polarized light (along the Y direction) and P(Z) is the optical power of the linear s-polarized light (along the Z direction). In practice, the polarization ratio $R_P$ can be estimated or calculated from the pulse energies $E_{polarization}$ and $E_{energy}$ reported by the observation system 305. For example, the polarization ratio $R_P$ (given as a percentage) can be estimated according to the following equation:

$$R_P = -12.128 \times [E_{polarization}/E_{energy}] + 100.4.$$

This calculation can yield an accurate value for the polarization ratio $R_P$ of a pulse of the light beam 110 as long as the pulse energies $E_{polarization}$ and $E_{energy}$ used in the calculation are sensed for the same pulse of the light beam 110.

Referring to FIGS. 11A and 11B, in some implementations, the optical element 120 is a partially-transmissive optical element 1120. The optical element 1120 is made of a bulk material that is selected based on the wavelength of the light beam 110 with which it interacts. For example, the optical element 1120 can be made of a material that transmits at least 90% of light having a wavelength that is between 100 nm and 400 nm. For example, the optical element 1120 can be made of a bulk material such as calcium fluoride ($CaF_2$). The bulk material of the $CaF_2$ can be formed in a crystalline lattice and ideally is symmetric and has very little inherent birefringence. It is possible that the bulk material of the $CaF_2$ is not perfectly symmetric; in this case, the bulk material could have a small amount of birefringence.

Because the adjustment of the polarization of the light beam 110 relies in part on reflecting light from the optical element 1120, the plane surface 1121 at the interface of the light beam 110 lacks an anti-reflective coating. Additionally, it is possible to add a reflective coating to the plane surface 1121.

The optical element 1120 is set up in the path of the light beam 110, which is traveling along the −X direction as an incoming light beam 1160. The coordinate system used is fixed relative to the incoming light beam 1160 and is relative to the incoming light beam 1160. The electric field of the incoming light beam 1160 is in the Y-Z plane. The electric field can be linearly polarized with a mix of p-polarized light and s-polarized light, and a mix of in-phase p-polarized light and s-polarized light is linearly polarized light that is an angle that is not parallel to either the Y or Z directions. In this example, the electric field direction of the incoming light beam 1160 that is in the Y direction is considered the p-polarized light because it is parallel with the plane of incidence (which is the X-Y plane in FIGS. 11A and 11B) at the optical element 1120. And, the electric field direction of the incoming light beam 1160 that is in the Z direction is considered to be the s-polarized light because it is perpendicular with the X-Y plane, which is the plane of incidence at the optical element 1120 in FIGS. 11A and 11B.

The optical element 1120 is oriented at an angle $\theta(Z)$ about the Z direction, and the angle $\theta(Z)$ is measured between the normal NO of a beam entrance (or plane) surface 1121 of the optical element 1120 and the −X direction (which is the axial direction of the incoming light beam 1160), as shown. Thus, the optical element 1120 is oriented with its plane surface 1121 perpendicular to the axis of the incoming light beam 1160 when the angle $\theta(Z)$ is at 0 degrees (in this case, the normal of the plane surface 1121 is parallel with the axis of the incoming light beam 1160). On the other hand, the optical element 1120 is oriented with its plane surface 1121 parallel to the axis of the incoming light beam 1160 when the angle $\theta(Z)$ is at 90 degrees (and the normal to the plane surface 1121 is perpendicular with the axis of the incoming light beam 1160).

By adjusting the angle $\theta(Z)$ of the optical element 1120 about the Z direction, the relative amount of p-polarized light (along the Y direction) and s-polarized light (along the Z direction) that is reflected 1150 from the optical element 1120 and transmitted 1155 through the optical element 1120 can be adjusted and the polarization ratio $R_P$ can be controllably increased. This is because the amount of p-polarized light that is reflected at a boundary BD (such as the plane surface 1121) between the optical element 1120 and the air or atmosphere around it is different from the amount of s-polarized light that is reflected at the boundary BD and the amount of p-polarized light that is transmitted through the optical element 1120 at the boundary BD is different from the amount of s-polarized light that is transmitted through the optical element 1120 at the boundary BD. The fraction of the incoming light beam 1160 reflected as light beam 1150 and transmitted as light beam 1155 for each of the p-polarized light and the s-polarized light is governed by Fresnel's equations. The simplest expressions (making assumptions about the boundary BD, and the incoming light beam 1160) depend on the conditions at the boundary BD, such as the ratio ($n_{OE}/n_i$) of the refractive index ($n_{OE}$) of the bulk material of the optical element 1120 to the refractive index ($n_i$) of the atmosphere around it.

The optical element 1120 is fixed (for example, connected) to an actuation apparatus 1125, and the actuation apparatus 1125 adjusts the position of the optical element 1120. In this example, the actuation apparatus 1125 is a rotation stage on which the optical element 1120 is fixed so that the actuation apparatus 1125 adjusts the angle $\theta(Z)$ by rotating the optical element 1120 about the Z direction.

In some implementations, the output apparatus 145 is designed to run most efficiently when it receives a light beam 110 that is linearly polarized in the Y direction (and thus, is p-polarized). While in other implementations, the output apparatus 145 is designed to run most efficiently when it receives a light beam 110 that is linearly polarized in the Z direction (and thus, is s-polarized). In yet other implementations, the output apparatus 145 is designed to run most efficiently when it receives a light beam 110 having linear polarization in both the Y direction and the Z direction or linear polarization at an angle within the Y-Z plane.

However, because of the disturbances 107 noted above, the polarization of the light beam 110 can degrade from its ideal polarized state and thus start to become polarized in an unfavorable direction. The actuation apparatus 1125 can therefore be used to adjust the angle $\theta(Z)$ of the optical element 1120 to adjust the relative amount of p-polarized light that is transmitted versus the amount of s-polarized light that is transmitted and thus adjust the polarization of the light beam 110. By adjusting the angle $\theta(Z)$, one can controllably increase the polarization ratio $R_P$ of the light beam 110 by removing light that is linearly polarized in the Z direction. It is alternatively possible to make adjustments to the optical element 1120 to decrease the polarization ratio $R_P$ of the light beam 110, and that will be discussed with reference to FIGS. 13A, 13B, and 14.

FIG. 12 shows a series of graphs of the polarization ratio of the transmitted light beam 1155 through the optical element 1120 as a function of the angle θ(Z) of the optical element 1120 for three different input polarization ratios of the incoming light beam 1160. Thus, FIG. 12 shows the polarization ratio $R_P$(Transmitted) of the transmitted light beam 1155 as a function of angle θ(Z) for three different input polarization ratios $R_P$(Input1, Input2, Input3). The three different input polarization ratios in this example are: $R_P$(Input1)=98.0%, $R_P$(Input2)=99.0%, and $R_P$(Input 3)=99.7%.

FIG. 12 also shows an intensity loss percentage IL of the incoming light beam 1160 as a function of the angle θ(Z), where the intensity loss IL of the incoming light beam 1160 is independent of the input polarization ratio for this range of polarization ratios. The intensity loss IL of the incoming light beam 1160 is the proportion of the intensity of the reflected light beam 1150 versus the intensity of the incoming light beam 1160 impinging upon the plane surface 1121 of the optical element 1120. Thus, when the angle θ(Z) approaches 90 degrees (which is grazing incidence), most of the incoming light beam 1160 is reflected from the optical element 1120 (and thus, about 100% of the incoming light beam 1160 is reflected from the optical element 1120). As another example, when the angle θ(Z) is less than about 69 degrees, very little of the incoming light beam 1160 is reflected as the reflected light beam 1150 (and thus, much of the incoming light beam 1160 is transmitted through the optical element 1120 as transmitted light beam 1155). Additionally, at an angle θ(Z) of 56 degrees (which is Brewster's angle), there is no loss for the light polarized in the Y direction (the p-polarized light). Thus, when θ(Z) is 56 degrees, then only s-polarized light (along the Z direction) is reflected as the reflected light beam 1150.

Referring to FIGS. 13A and 13B, in order to decrease the polarization ratio ($R_P$), light that is linearly polarized in the Y direction should be removed from the light beam 110. As shown in FIGS. 13A and 13B, the optical element 1120 is oriented at an angle θ(Y) about the Y direction, and the angle θ(Y) is measured between the normal NO of the plane surface 1121 and the −X direction, which is the direction of the axis of the incoming light beam 1360. Thus, the optical element 1120 is oriented with its plane surface 1121 perpendicular to the axis of the incoming light beam 1360 when the angle θ(Y) is at 0 degrees (in this case, the normal of the plane surface 1121 is parallel with the axis of the incoming light beam 1360). On the other hand, the optical element 1120 is oriented with its plane surface 1121 parallel to the axis of the incoming light beam 1360 when the angle θ(Y) is at 90 degrees (and the normal to the plane surface 1121 is perpendicular with the axis of the incoming light beam 1360).

As shown in FIGS. 13A and 13B, the electric field of the incoming light beam 1360 is in the Y-Z plane. The electric field can be linearly polarized with a mix of p-polarized light and s-polarized light. In the example of FIGS. 13A and 13B, the electric field direction of the incoming light beam 1360 that is in the Y direction is considered the s-polarized light because it is perpendicular with the plane of incidence (which is the X-Z plane in FIGS. 13A and 13B) at the optical element 1120. And, the electric field direction of the incoming light beam 1360 that is in the Z direction is considered to be the p-polarized light because it is parallel with the X-Z plane, which is the plane of incidence at the optical element 1120 in FIGS. 13A and 13B.

By adjusting the angle θ(Y) of the optical element 1120 about the Y direction, the relative amount of s-polarized light (along the Y direction) and p-polarized light (along the Z direction) that is reflected 1350 from the optical element 1120 and transmitted 1355 through the optical element 1120 can be adjusted and the polarization ratio $R_P$ of the light beam 110 (which is the transmitted light beam 1355) can be controllably decreased. As discussed above, this is because the amount of p-polarized light that is reflected at a boundary BD (such as the plane surface 1121) between the optical element 1120 and the air or atmosphere around it is different from the amount of s-polarized light that is reflected at the boundary BD and the amount of p-polarized light that is transmitted through the optical element 1120 at the boundary BD is different from the amount of s-polarized light that is transmitted through the optical element 1120 at the boundary BD. The fraction of the incoming light beam 1360 reflected as light beam 1350 and transmitted as light beam 1355 for each of the p-polarized light and the s-polarized light is governed by Fresnel's equations. The simplest expressions (making assumptions about the boundary BD, and the incoming light beam 1360) depend on the conditions at the boundary BD, such as the ratio ($n_{OE}/n_i$) of the refractive index ($n_{OE}$) of the bulk material of the optical element 1120 to the refractive index ($n_i$) of the atmosphere around it.

The optical element 1120 is fixed (for example, connected) to an actuation apparatus 1325, and the actuation apparatus 1325 adjusts the position of the optical element 1120. In this example, the actuation apparatus 1325 is a rotation stage on which the optical element 1120 is fixed so that the actuation apparatus 1325 adjusts the angle θ(Y) by rotating the optical element 1120 about the Y direction.

The actuation apparatus 1325 is used to adjust the angle θ(Y) of the optical element 1120 to adjust the relative amount of p-polarized light that is transmitted versus the amount of s-polarized light that is transmitted. By adjusting the angle θ(Y), one can controllably decrease the polarization ratio $R_P$ by removing light that is linearly polarized in the Y direction.

FIG. 14 shows a series of graphs of the polarization ratio of the transmitted light beam 1355 through the optical element 1120 as a function of the angle θ(Y) of the optical element 1120 for three different input polarization ratios of the incoming light beam 1360. Thus, FIG. 14 shows the polarization ratio $R_P$(Transmitted) of the transmitted light beam 1355 as a function of angle θ(Y) for three different input polarization ratios $R_P$(Input1, Input2, Input3). The three different input polarization ratios in this example are: $R_P$(Input1)=98.0%, $R_P$(Input2)=99.0%, and $R_P$(Input 3)=99.7%.

FIG. 14 also shows an intensity loss percentage IL of the incoming light beam 1360 as a function of the angle θ(Y), where the intensity loss IL of the incoming light beam 1360 is independent of the input polarization ratio for this range of polarization ratios. The intensity loss IL of the incoming light beam 1360 is the proportion of the intensity of the reflected light beam 1350 versus the intensity of the incoming light beam 1360 impinging upon the plane surface 1121 of the optical element 1120. Thus, when the angle θ(Y) approaches 90 degrees (which is grazing incidence), most of the incoming light beam 1360 is reflected from the optical element 1120 (and thus, about 100% of the incoming light beam 1360 is reflected from the optical element 1120). As another example, when the angle θ(Y) is less than about 21 degrees, very little of the incoming light beam 1360 is reflected as reflected light beam 1350 (and thus, much of the incoming light beam 1360 is transmitted through the optical element 1120 as transmitted light beam 1355).

Figure 15:
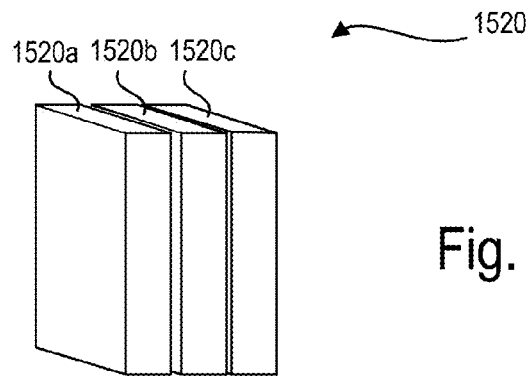
FIG. 15 is a perspective view of an exemplary optical element that can be used in the photolithography system of FIG. 1.

Although FIGS. 11A, 11B, 13A, and 13B show an optical element 120 made of a single flat optic, it is alternatively possible that the optical element 120 is made up of a plurality of flat and adjacent optics to provide a plurality of boundaries BD at which to enable further filtering of specific linear polarizations from the light beam 110. FIG. 15 shows an exemplary optical element 120 that is a stack of three flat and adjacently positioned bulk optics 1520a, 1520b, 1520c, with gaps between each of the bulk optics 1520a, 1520b, 1520c.

Figure 16:
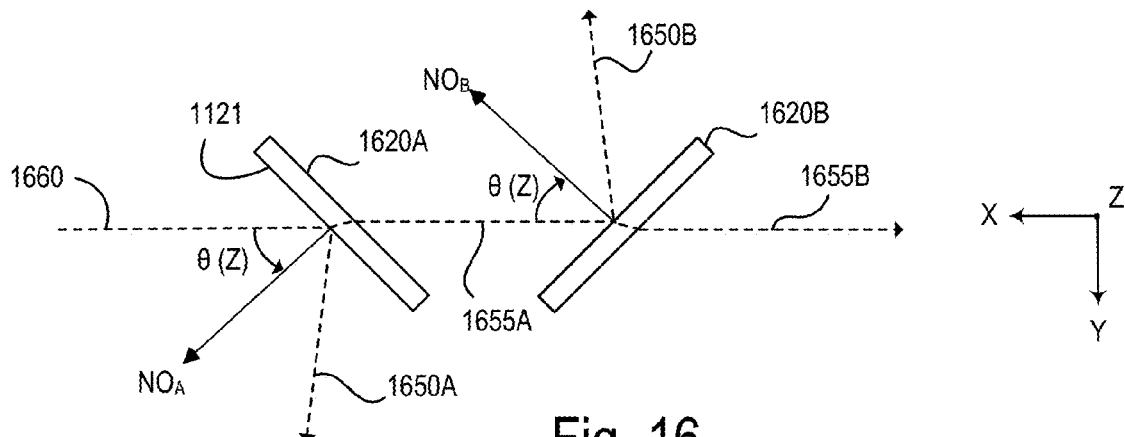
FIG. 16 is a plan view of a two-part optical element that can be used in the photolithography system of FIG. 1.
Figure 17:
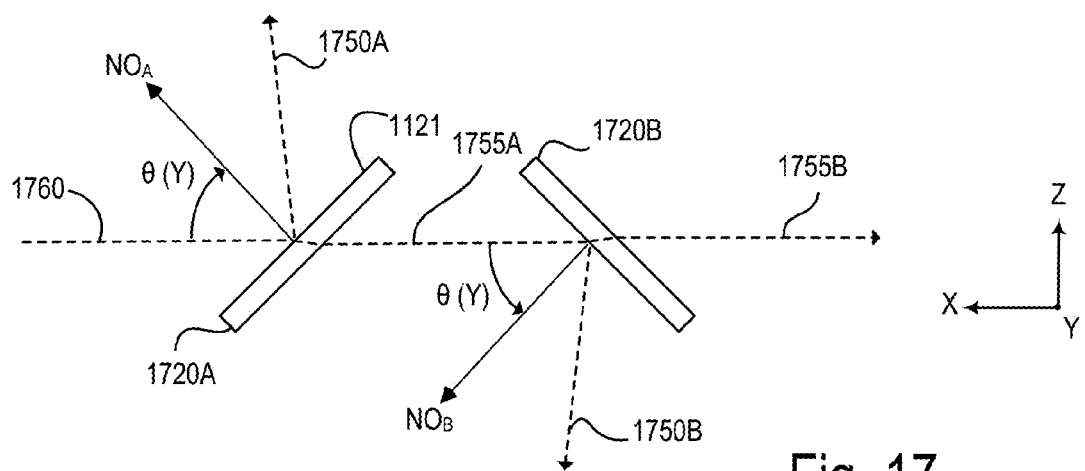
FIG. 17 is a plan view of a two-part optical element that can be used in the photolithography system of FIG. 1.

In other implementations, such as shown in FIGS. 16 and 17, the optical element 120 is a two-part optical element 1620 or 1720, respectively.

FIG. 16 is similar to the arrangement shown in FIG. 11A, except that the two-part optical element 1620 is designed with a first flat optic 1620A that is arranged like the optical element 1120 of FIG. 11A, and a second flat optic 1620B that is arranged with its normal $NO_B$ rotated 90 degrees from the normal $NO_A$ of the first flat optic 1620A. In this arrangement, a beam shift of the light beam 110 can be avoided by passing the light beam 110 through two flat optics having normals $NO_A$, $NO_B$ that are 90 degrees offset from each other. Thus, the transmitted light beam 1655A from the first flat optic 1620A is shifted relative to the incoming light beam 1660 due to traveling through the bulk material of the first flat optic 1620A. The transmitted light beam 1655A is fed into the second flat optic 1620B and because the second flat optic 1620B is rotated by 90 degrees relative to the first flat optic 1620A, the transmitted light beam 1655B is shifted by an amount that is opposite to the amount that the transmitted light beam 1655A is shifted. Because of this, the transmitted light beam 1655B is aligned or nearly aligned with the incoming light beam 1660.

FIG. 17 is similar to the arrangement shown in FIG. 13A, except that the two-part optical element 1720 is designed with a first flat optic 1720A that is arranged like the optical element 1120 of FIG. 13A, and a second flat optic 1720B that is arranged with its normal $NO_B$ rotated 90 degrees from the normal $NO_A$ of the first flat optic 1720A. In this arrangement, a beam shift of the light beam 110 can be avoided by passing the light beam 110 through two flat optics having normals $NO_A$, $NO_B$ that are 90 degrees offset from each other. Thus, the transmitted light beam 1755A from the first flat optic 1720A is shifted relative to the incoming light beam 1760 due to traveling through the bulk material of the first flat optic 1720A. The transmitted light beam 1755A is fed into the second flat optic 1720B and because the second flat optic 1720B is rotated by 90 degrees relative to the first flat optic 1720A, the transmitted light beam 1755B is shifted by an amount that is opposite to the amount that the transmitted light beam 1755A is shifted. Because of this, the transmitted light beam 1755B is aligned or nearly aligned with the incoming light beam 1760.

The optical element 120 used in FIGS. 11A-17 can be made of calcium fluoride ($CaF_2$). For a light beam having a wavelength of 193 nm, a protective coating can be applied to the bulk $CaF_2$ optical element 120 to reduce or prevent damage to the bulk $CaF_2$ in high fluence applications. Such a protective coating can be selected to have an index of refraction that is very close to the index of refraction of $CaF_2$ and thus, the shape of the graphs shown in FIGS. 12 and 14 should be nearly maintained in this implementation. The $CaF_2$ optical element 120 can be purchased from manufacturers such as Corning, Nikon, or Hellma. The optical element 120 made of $CaF_2$ is a flat piece of high-purity single crystal $CaF_2$ and is selected for high transmission and robustness for applications that use a light beam 110 having a wavelength in the deep ultraviolet range. On a macroscopic level, the $CaF_2$ optical element 120 can be considered as homogenous but on a microscopic level, the $CaF_2$ optical element 120 has a crystalline structure. Another material that could work for the optical element 120 is fused silica. The material of the optical element 120 can be selected based on the materials used in the illuminator system of the lithography exposure apparatus 145; thus, if materials such as sapphire, Ge, ZnS, ZnSe, or $MgF_2$ are used in the lithography exposure apparatus 145, then it may be suitable to make the optical element 120 using such a material.

Figure 18:
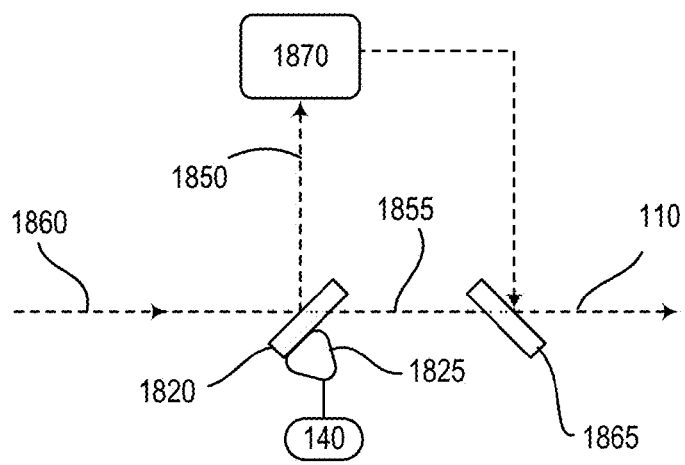
FIG. 18 is a plan view of an exemplary optical element that is a partially-transmissive optic that splits the light beam output from the optical source of the photolithography system of FIG. 1 into a transmitted beam and a reflected beam.

Referring to FIG. 18, in other implementations, the optical element 120 is a partially-transmissive optic 1820 that is used to split the light beam 110 as an incoming light beam 1860 into a transmitted beam 1855 and reflected beam 1850. As shown, the reflected beam 1850 is directed through an optical arrangement 1870. It is alternatively or additionally possible for the transmitted beam 1855 to be directed through a separate optical arrangement. The reflected beam 1850 (after passing through the optical arrangement 1870) can be recombined with the transmitted beam 1855 at beam combiner 1865 to form the light beam 110. In this implementation, the actuation apparatus 125 includes a stress apparatus 1825 that is configured to adjust a stress of the optic 1820 based on a control signal from the control module 140. Adjustment of the stress of the optic 1820 causes a change in the polarization of the light beam 110. For example, the stress apparatus 1825 can be a thermal element that is thermally connected to the optic 1820 to change the temperature of the optic 1820. The temperature change applied to the optic 1820 effects the birefringence of the bulk material of the optic 1820. For example, a reduction of the temperature of the optic 1820 from an ambient temperature can reduce the birefringence of the optic 1820 when compared to the birefringence of the optic 1820 at the ambient temperature. Or, an increase in the temperature of the optic 1820 from the ambient temperature can increase the birefringence of the optic 1820 when compared with the birefringence of the optic 1820 at the ambient temperature. As the birefringence increases, the polarization of the transmitted light beam 1855 degrades because the optic 1820 refracts the s and p polarizations differently.

In some implementations, the optic 1820 is made of bulk $CaF_2$; heat added to the $CaF_2$ optic 1820 causes stress to the naturally birefringent cubic crystalline structure of the $CaF_2$, and produces even stronger anisotropic optical properties such as birefringence resulting in the change in polarization.

In some implementations, the stress apparatus 1825 is a wire heating element attached to the optic 1820. In such a design, the control module 140 provides an electric signal to the wire heating element attached to the optic 1820 so as to control the amount of power supplied to the wire heating element. In other implementations, the stress apparatus 1825 is an infrared light beam directed toward a surface of the optic 1820. In such a design, the control module 140 provides an electrical signal to a source that produces the infrared light beam so as to control an amount of power in the infrared light beam. In other implementations, the stress apparatus 1825 applies a physical stress to the optic 1820 by applying a bending moment, tension, or compression to the optic 1820.

The optical arrangement 1870 can be a delay line or a pulse stretcher.

Figure 19:
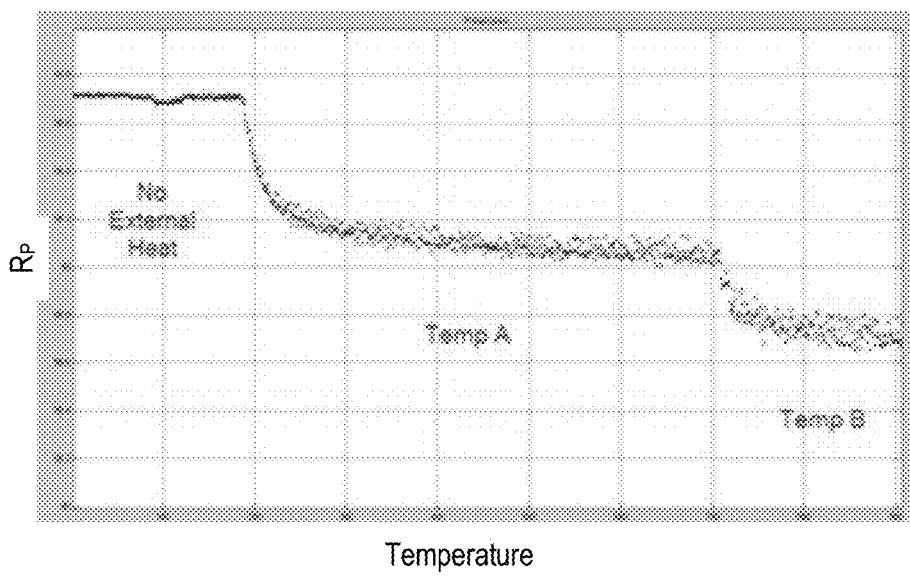
FIG. 19 is a graph of the polarization ratio of the transmitted light beam versus the temperature of the optic of FIG. 18.

Referring to FIG. 19, the polarization ratio $R_P$ of the transmitted light beam 1855 is shown versus the temperature of the optic 1820. As shown, the polarization ratio $R_P$ of the transmitted light beam 1855 decreases as the temperature of the optic 1820 increases.

Figure 20:
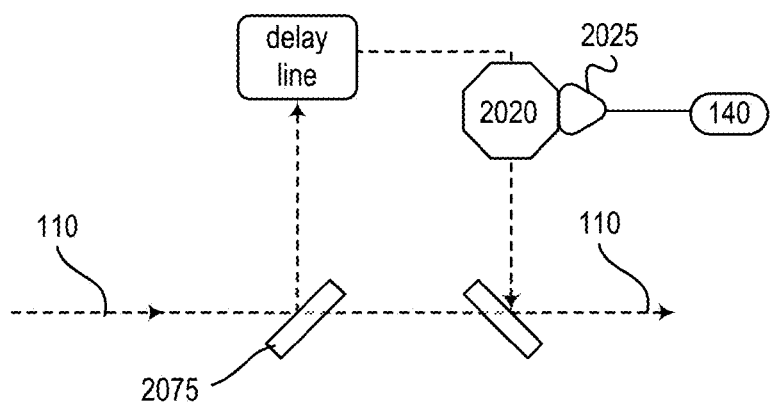
FIG. 20 is a plan view of an exemplary optical element that is a variable optical phase retarding element in the path of the light beam output from the optical source in the photolithography system of FIG. 1.

Referring to FIG. 20, in other implementations, the optical element 120 is a variable optical phase retarding element 2020 in the path of the light beam 110 output from the optical source 105. The variable optical phase retarding element 2020 can be placed within a pulse stretcher or delay line to compensate for polarization degradation at other optical elements, such as the beam splitter 2075. The variable optical phase retarding element 2020 can be or can include a piezo-elastic modulator and it can be used to compensate for undesired birefringence in the beam splitter 2075. The element 2020 can be made of a bulk material such as $CaF_2$. The actuation apparatus 125 associated with the optical element 2020 can use a piezoelectric transducer 2025 to vibrate the optical element 2020 along a linear axis at a natural resonant frequency of the optical element 2020. Vibrating the optical element 2020 at a controlled frequency allows for control of the birefringence of the optical element 2020 and thus can be used to slow down or speed up the relative polarizations (s and p-polarization). This changes a phase of the light beam 110, and can be used to decrease a polarization purity. Moreover, two out of phase s polarization light and p polarization light when combined would make elliptically-polarized light, which can be used for lithography processes that require elliptically-polarized light.

In other implementations, the variable optical phase retarding element 2020 and the piezoelectric transducer 2025 are placed outside a pulse stretcher or delay line.

In other implementations, the variable optical phase retarding element 2020 can be a Babinet-Soleil compensator, which uses a birefringent wedged optic to change a phase of the light beam 110 and can change linear polarization to circular polarization, for example. For example, the Babinet-Soleil compensator can include two wedges of the same wedge angle and a fixed parallel plate; in which the optic axes of the two wedges have the same orientation. Together, these elements form a variable thickness plate. One of the wedges is assembled to the fixed parallel plate. The optic axis of the parallel plate is at 90 degrees to that of the wedges. The other wedge is attached to a micrometer and moves to produce a thickness difference between the fixed and variable thickness plates, thus producing a variable phase delay. An optional rotatable mount can be used to allow easy and accurate adjustment of the Babinet-Soleil compensator's azimuthal angle to within an accuracy of less than one arc minute. A dovetail slide can permit the Babinet-Soleil compensator to be easily removed from the light beam path. In some implementations, the Babinet-Soleil compensator can be catalog number BSMF-13-2 purchased from Karl Lambrecht Corporation of Chicago, Ill.

In other implementations, the Babinet-Soleil compensator could be used outside of the pulse stretcher or delay line to compensate for polarization degradation. For example, the Babinet-Soleil compensator could be the optical element 120, and could be placed at such positions such as shown in FIGS. 7-10 or it could be configured as the rotatable optical element 1120 described with reference to FIGS. 11A-14.

Referring to FIG. 21A, an exemplary procedure 2100 is performed by the photolithography system 100 to control a polarization of a light beam 110 supplied to an output apparatus 145. In the procedure 2100, the light beam 110 is supplied to an output apparatus 145, which can be a photolithography exposure apparatus (2105). As shown in FIG. 21B, the light beam 110 can be supplied according to a procedure 2105 that includes producing, at the optical source 105, the pulsed light beam 110 having an optical axis that defines a beam path (2110). The optical axis of the pulsed light beam 110 can extend along the −X direction in coordinate system that is fixed to the light beam 110. The procedure 2105 also includes, directing the produced pulsed light beam 110 (2110) through the plurality of optical components 115 positioned between the optical source 105 and the photolithography exposure apparatus 145 (2112), and interacting the pulsed light beam 110 with the optical element 120 on the beam path of the light beam 110, the beam path being from and including the optical source 105 to the photolithography exposure apparatus 145 (2114).

The procedure 2100 includes receiving one or more parameters relating to the pulsed light beam 110 or to the photolithography exposure apparatus 145 (2115). The one or more parameters that can be received (2115) can include a polarization of the light beam 110 that is measured, for example, by the metrology system 150. In some implementations, the parameters that are received (2115) include parameters (such as the polarization ratio $R_P$) that are estimated or calculated either within the control module 140 or within the observation system 305) from the pulse energies sensed by the observation system 305 of the metrology system 150.

Next, the photolithography system 100 determines whether any of the received one or more parameters is outside an acceptable range of target values for that parameter (2120). For example, the control module 140 (specifically, the decision processing system 535) can make this determination 2120. Thus, if the parameter is the polarization ratio $R_P$, then it can be determined whether the polarization ratio $R_P$ is outside an acceptable range of target values (2120). The parameter could be a value related to the polarization and could be something other than the polarization ratio $R_P$. If it is determined that a received value (for example, of the polarization ratio $R_P$) is not within its acceptable range of target values (2120), then the photolithography system 100 determines an adjustment to a polarization of the pulsed light beam 110 (2125). For example, the control module 140 (and specifically, the decision processing system 535) can determine the adjustment to the polarization of the pulsed light beam 110 at 2125 and can also determine which actuation sub-system of the actuation processing system 555 needs to be activated. The photolithography system 100 adjusts a physical property of the optical element 120 (2130) based on the determined adjustment (2125) to the pulsed light beam polarization to thereby adjust the polarization of the pulsed light beam 110 output from the optical element 120 (2135). For example, the control module 140 (and specifically the sub-system of the actuation processing system 555) sends a signal to the actuation apparatus 125 to adjust the physical property (for example, an angle, a position, a stress, or a temperature, as discussed above) of the optical element 120 at 2130.

The steps performed by the photolithography system 100 during the procedure 2100 are performed while the pulsed light beam 110 is supplied to the output apparatus 145. Thus, for example, the determination of whether to adjust the physical property of the optical element 120 at 2120 and the adjustment of the physical property of the optical element 120 at 2130 occurs while the light beam 110 is being supplied to the output apparatus 145. Because of this, the procedure 2100 does not interrupt operation of the output apparatus 145. For example, if the output apparatus 145 is a photolithography exposure apparatus, then the procedure 2100 does not interrupt operation of patterning of the wafer by the illuminator system (FIG. 6). In this way, the procedure 2100 provides for a programmable polarization state control system. Moreover, the steps performed during the procedure 2100 can happen on a pulse to pulse basis of the light beam 110; thus, for example, steps 2115-2135 can happen for each pulse of the light beam 110. For example, if the repetition rate of the optical source 105 is 6 kHz then the pulse to pulse timing is about 167 microseconds, which means that the physical property of the optical element 120 is being changed every 167 microseconds. Such fast timing is more likely to be feasible when the physical property of the optical element 120 that is adjusted is an electrical impulse or a light induced response.

In some implementations, the optical element 120 is a component that is added to the photolithography system 100 to provide such polarization control, such as shown in FIGS. 11A, 11B, 13A, 13B, and 20. In other implementations, the optical element 120 is a component that is already a part of the photolithography system 100, such as shown in FIG. 18. In both implementations, the optical element 120 is configured to provide dynamic control during operation of the output apparatus 145.

The time scales at which the steps 2115-2135 can happen depend on the way in which the physical property of the optical element 120 is adjusted at steps 2130. For example, adjustment of the temperature of the optical element 120 can take more time than adjustment of the position or angle of the optical element 120. For example, adjustment of the position or angle of the optical element 120 can happen on a pulse-to-pulse basis while adjustment of the temperature of the optical element 120 may happen over the course of a plurality of pulses of the light beam 110.

In FIGS. 11A, 11B, 13A, and 13B, the transmitted light beam 1155, 1355 is used as the light beam 110 that is directed to the output apparatus 145. However, it is alternatively or additionally possible to use the reflected light beam 1150, 1350 as the light beam 110 directed to the output apparatus 145.

In other implementations, the optical element 120 includes a diffractive optical element or a reflective optical element such as a deformable mirror. A mirror (whether or not it is deformable) could have reflective coatings that have polarization dependent reflectivity to change the polarization of the light reflected by the coating.

What is claimed is:

1. A photolithography system comprising:
an optical system comprising:
an optical source that produces a pulsed light beam traveling along a beam path;
a plurality of optical components positioned between the optical source and a photolithography exposure apparatus, at least some of the plurality of optical components configured to receive the pulsed light beam and direct the pulsed light beam to the photolithography exposure apparatus; and
an optical element positioned to interact with the pulsed light beam;
an actuation apparatus coupled to the optical element, the actuation apparatus comprising a rotation mechanism to which the optical element is fixed, wherein the rotation mechanism is configured to adjust an angle of the optical element relative to an optical axis of the pulsed light beam based on a control signal to thereby adjust a polarization of the pulsed light beam; and
a control module connected to the photolithography exposure apparatus, the optical system, and the actuation apparatus, the control module configured to:
receive one or more parameters from one or more of the photolithography exposure apparatus and the optical system,
analyze the one or more parameters to determine whether any of the parameters is outside an acceptable range of target values; and
if the determination indicates that any of the parameters is outside the acceptable range of target values, send the control signal to the actuation apparatus to adjust the angle of the optical element to thereby alter the polarization of the pulsed light beam;
wherein the rotation mechanism either adjusts an angle of the optical element about a perpendicular element axis that is perpendicular to a first direction of polarization of the pulsed light beam or adjusts an angle of the optical element about a parallel element axis that is parallel with the first direction of polarization of the pulsed light beam.

2. The system of claim 1, wherein the optical element comprises an at least partially-transmissive optical element.

3. The system of claim 2, wherein the at least partially-transmissive optical element lacks an anti-reflective coating.

4. The system of claim 2, wherein the at least partially-transmissive optical element directs the pulsed light beam through an optical pulse stretcher.

5. The system of claim 2, wherein the at least partially-transmissive optical element is made of calcium fluoride.

6. The system of claim 2, wherein the at least partially-transmissive optical element is made of a bulk material that transmits at least 90% of light having a wavelength that is between 100 nm and 400 nm.

7. The system of claim 1, wherein the control module receives one or more parameters from one or more of the photolithography exposure apparatus and the optical system by receiving a measurement of the polarization of the pulsed light beam.

8. The system of claim 1, wherein the control module is configured to determine the control signal based on a determined adjustment to the property of the pulsed light beam.

9. The system of claim 1, wherein the optical element comprises a variable optical phase retarding element.

10. The system of claim 1, wherein the optical element is between the optical source that produces a pulsed light beam and the plurality of optical components.

11. The system of claim 1, wherein the optical source comprises a two-stage laser system that includes a master oscillator that provides a seed light beam to a power amplifier.

12. The system of claim 1, wherein adjusting the angle of the optical element alters the polarization by adjusting a relative amount of light that is reflected from and transmitted through the optical element.

13. A photolithography method comprising:
supplying a pulsed light beam to a photolithography exposure apparatus, the supplying comprising:
producing, at an optical source, a pulsed light beam traveling along a beam path;
directing the produced pulsed light beam through a plurality of optical components positioned between the optical source and the photolithography exposure apparatus; and
interacting the pulsed light beam with an optical element;
receiving one or more parameters relating to the pulsed light beam or to the photolithography exposure apparatus;

determining whether any of the received one or more parameters is outside an acceptable range of target values for that parameter;

if it is determined that a received parameter is not within its acceptable range of target values, then determining an adjustment to a polarization of the pulsed light beam; and adjusting an angle of the optical element relative to an optical axis of the pulsed light beam based on the determined adjustment to the pulsed light beam polarization to thereby alter the polarization of the pulsed light beam output from the optical element;

wherein adjusting the angle of the optical element relative to the optical axis comprises either adjusting the angle of the optical element about a perpendicular element axis that is perpendicular to a first direction of polarization of the pulsed light beam or adjusting the angle of the optical element relative to the optical axis comprises adjusting the angle of the optical element about a parallel element axis that is parallel with the first direction of polarization of the pulsed light beam.

14. The method of claim 13, wherein adjusting the angle of the optical element to thereby alter the polarization of the pulsed light beam output from the optical element occurs while the pulsed light beam is being supplied to the photolithography exposure apparatus.

15. The method of claim 13, wherein receiving one or more parameters comprises receiving a measurement of the polarization of the pulsed light beam.

16. The method of claim 13, wherein adjusting the angle of the optical element alters the polarization of the pulsed light beam by adjusting a relative amount of light that is reflected from and transmitted through the optical element.

17. A method comprising:
supplying a pulsed light beam to a photolithography exposure apparatus, the supplying comprising:
producing, at an optical source, a pulsed light beam traveling along a beam path; and
interacting the pulsed light beam with an optical element on the beam path;
receiving one or more parameters relating to the pulsed light beam or to the photolithography exposure apparatus;
determining whether any of the received one or more parameters is outside an acceptable range of target values for that parameter; and
based on the determination, altering the polarization of the pulsed light beam by adjusting an amount of light that is reflected from the optical element relative to the amount of light that is transmitted through the optical element by adjusting an angle of the optical element about an axis perpendicular to an optical axis of the pulsed light beam, wherein adjusting the angle of the optical element relative to the optical axis comprises either adjusting the angle of the optical element about a perpendicular element axis that is perpendicular to a first direction of polarization of the pulsed light beam or adjusting the angle of the optical element about a parallel element axis that is parallel with the first direction of polarization of the pulsed light beam.

18. The method of claim 17, wherein adjusting the physical property of the optical element to thereby alter the polarization of the pulsed light beam output from the optical element occurs while the pulsed light beam is being supplied to the photolithography exposure apparatus.

19. The method of claim 17, wherein receiving one or more parameters comprises receiving a measurement of the polarization of the pulsed light beam.

20. The method of claim 17, wherein adjusting the angle of the optical element about the perpendicular element axis thereby adjusts an amount of first light transmitted through the optical element relative to an amount of second light transmitted through the optical element, wherein the first light is light that is polarized along the first direction of polarization and the second light is light that is polarized along a second direction of polarization that is perpendicular to the first direction of polarization.

21. The method of claim 20, wherein increasing the angle of the optical element about the perpendicular element axis from 0° to 90° thereby increases a polarization ratio of the pulsed light beam by removing the amount of second light transmitted through the optical element.

22. The method of claim 17, wherein adjusting the angle of the optical element about the parallel element axis thereby adjusts an amount of second light transmitted through the optical element relative to an amount of first light transmitted through the optical element, wherein the first light is light that is polarized along the first direction of polarization and the second light is light that is polarized along a second direction of polarization that is perpendicular to the first direction of polarization.

23. The method of claim 22, increasing the angle of the optical element about the parallel element axis from 0° to 90° thereby decreases a polarization ratio of the pulsed light beam by removing the amount of first light that is transmitted through the optical element.

* * * * *